US006087846A

United States Patent [19]

Alvord et al.

[11] Patent Number: 6,087,846

[45] Date of Patent: Jul. 11, 2000

[54] SELF-TEST ROUTINE FOR LED DISPLAY

[75] Inventors: Robert J. Alvord, Elmwood Park; Leonard W. Jenski, Roselle, both of Ill.

[73] Assignee: Ranco Incorporated of Delware, Wilmington, Del.

[21] Appl. No.: 09/314,043

[22] Filed: May 18, 1999

Related U.S. Application Data

[62] Division of application No. 08/911,331, Aug. 14, 1997.

[51] Int. Cl.[7] .......................... G01R 31/00; G01R 31/26

[52] U.S. Cl. .......................... 324/767; 324/770; 324/73.1

[58] Field of Search .......................... 324/767, 770, 324/73.1, 764, 537, 96

[56] References Cited

U.S. PATENT DOCUMENTS 5,268,635 12/1993 Bortolini et al. .......................... 324/96
5,444,390 8/1995 Bartlett et al. .......................... 324/770
5,832,419 11/1998 Voshell et al. .......................... 324/73.1

*Primary Examiner*—Josie Ballato
*Assistant Examiner*—Minh Tang
*Attorney, Agent, or Firm*—Leydig, Voit & Mayer, Ltd.

[57] ABSTRACT

A method and apparatus for operating and executing a self-test routine of an LED display device adapted for assembly into home appliance. The device is comprised of a plurality of LED elements, a control processor, a switch assembly, and a signaling element. The self-test routine comprises disposing the switch assembly in a predetermined pattern for detecting switch operability and initiating a program in the processor for self-testing of illumination of the LED elements. The elements are monitored during the self-test routine for communicating a minimum current level preselected as identifying proper illumination. Failure of the self-test routine to properly detect minimum current levels precludes a proper response from the signaling element within a predetermined time limit, thereby causing the display device to be identified as an unacceptable device.

15 Claims, 4 Drawing Sheets

SELF-TEST ROUTINE FOR LED DISPLAY

RELATED APPLICATION

This is a divisional of, and claims priority to, U.S. patent application Ser. No. 08/911,331 filed Aug. 14, 1997 pending, the subject matter of which is incorporated herein by reference.

BACKGROUND OF THE INVENTION

The subject invention pertains to the art of numeric displays, and in particular to light emitting diode (LED) display elements and a circuit assembly for operating and testing operability of the elements themselves.

The invention is particularly applicable to a time of day (TOD) or timing display used in a home cooking range. Such display assemblies often comprise a numeric display of segmented LEDs, arranged to form four digits. The displays have been successfully utilized in the higher temperature environments required for range use. Such LEDs have the advantages of high reliability at low cost, while providing a display that has been readily accepted by users to conveniently convey the desired time and timing information. Setting of the time displayed by the LEDs is accomplished by an operator accessible switch assembly.

In accordance with conventional manufacturing and assembly standards, before any such display can be assembled into a heating range, the display itself, its control circuitry and the operating switches must be tested for operability. As far as the display elements themselves are concerned, such testing is mainly concerned with identifying circuit integrity such as microconnections although element operability is also tested. Tests for open or shorted circuits to the LED segment elements are performed. If each digit in the display is comprised of seven linear segments and a decimal point, then for each digit, eight separate segment elements exist and each must be tested for operability.

The most notable problem with preexisting testing routines for range display assemblies has been the requirement that a human operator must visually observe whether each and every display element is properly illuminated as they are powered. Any noticed failure in illumination indicates either a connection fault or a faulty LED element itself. Requiring an operator to actually look at the display to evaluate operability is a tedious and expensive task and has been found to be unacceptably ineffective in identifying the particular problems with the display elements, the microconnections or the operating switches. The tedium is easily appreciated by merely considering the circumstances of having to repeatedly view test illuminations of LED displays. Expense becomes a factor due to the cost of test equipment necessary to be operated by the human operator as well as the cost of operator time in performing the tests. The inefficiency of the test operation itself results from possible human error occurring due to the difficulty and stress of running the test over a long period of time, as well as ineffectiveness in identifying the actual nature of the fault or failure involved between wiring, LED or switch.

The present invention contemplates a new and improved LED control circuit and self test routine which overcomes the above-referred to problems and others to provide a new LED display assembly, which is simple in design, economical to manufacture and test, can readily withstand the heated environment of a cooking range and which provides a highly efficient means for executing a test routine obviating operator participation in the test itself.

BRIEF SUMMARY OF THE INVENTION

In accordance with the present invention, there is provided a method and apparatus particularly suited for testing whether input and output signal paths among a control processor, a switch assembly and an LED display, all intended for assembly in an appliance device as a time of day display, are commercially acceptable. In particular, the segments of the LED display device itself must illuminate when appropriate drive signals are applied. The apparatus is comprised of conventional processor digit drive and segment drive circuit portions, a power supply and a signaling element comprising a beeper, but further includes a monitoring portion interposed between the processor and the LED drives to detect if an illuminating power signal is being applied to the LED segments when desired. The processor further monitors if the operating switch assembly is properly communicating as desired. More particularly, the LED display is comprised of a conventional four (4) digit display, wherein each digit is comprised of seven (7) linear segments and a decimal point. Drive to each of the elements is effected by the digit drive and the segment drive. When both the digit drive and the segment drive are enabled by process control, a segment should be illuminated. During illumination current will necessarily pass through the segment and monitoring of the current through the segment by the processor allows detection of operability without human observation of the actual illumination.

In accordance with another aspect of the present invention, a method is provided for implementing a test routine of the display device, wherein the device is comprised of a power source, a plurality of LED elements, a control processor disposed for controlling the power signals to the LED elements, a switch assembly for selectively controlling the control processor and a signaling element for signaling a state of the display device.

The method comprises steps of disposing the switch assembly in a predetermined pattern for controlling the processor to communicate a test pattern of power signals suitable for testing operability of the LED elements; communicating the test pattern to the LED elements; monitoring a parameter representative of operability of the LED elements; communicating the parameter to the control processor for comparing the parameter with a predetermined parameter indicative of successful operability of the LED elements; communicating a result signal from the processor to the signaling element representative of a result of the comparing; and operating the signaling element in accordance with the result signal.

In accordance with a more limited aspect of the present invention, the monitoring comprises detecting a desired circuit state condition indicative of either a switch state or an illuminating energy application to any segment of the LED elements during said communicating of the test pattern of the power signals. The disposing the switch assembly in a predetermined pattern not only initiates the self-test routine but also tests if the switches are operating properly. The communicating of the test pattern comprises detecting the circuit state condition within a predetermined time limit, and upon failure to detect the desired circuit state condition within said time limit, identifying the LED display device as unacceptable.

One benefit obtained by the present invention is a test routine for an LED display device which obviates operator control and observation of the test process itself.

Another benefit obtained from the present invention is a test routine which precludes separate expensive test equipment. The subject invention incorporates a test routine program and circuity equipment in the LED display device itself.

Other benefits and advantages for the subject, new self-test routine and circuit assembly for an LED display will become apparent to those skilled in the art upon a reading and understanding of this specification.

BRIEF DESCRIPTION OF THE DRAWINGS

The invention may take physical form in certain parts and arrangements of parts, or as a routine in an arrangement of certain steps, the preferred embodiments of which will be discussed in detail in this specification and illustrated in the accompanying drawings which form a part hereof and wherein.

DETAILED DESCRIPTION OF THE INVENTION

Figure 1:
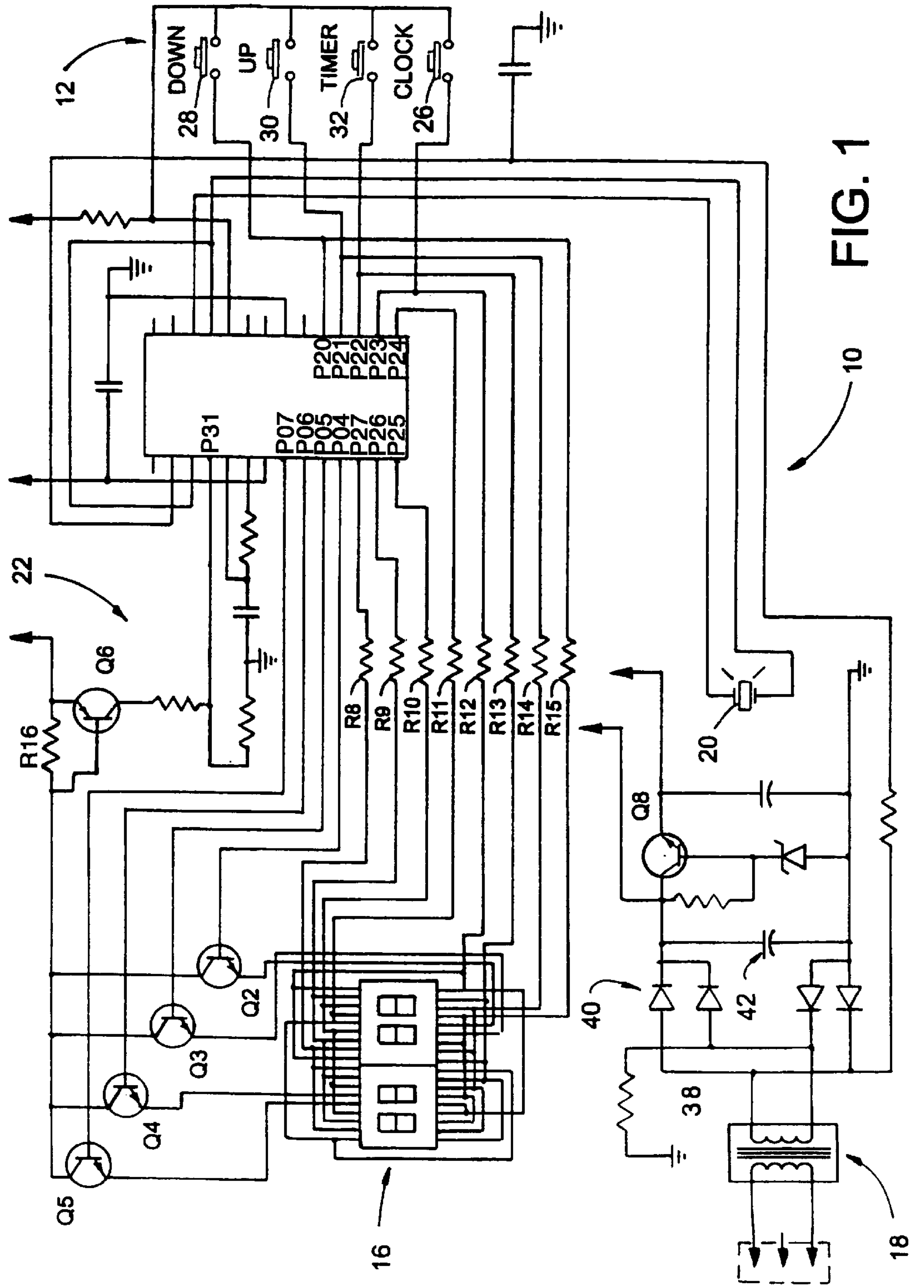
FIG. 1 is a schematic diagram of a circuit assembly formed in accordance with the present invention.

Referring now to the drawings wherein the showings are for purposes of illustrating the preferred embodiments of the invention only, and not for purposes of limiting same, FIG. 1 shows a schematic diagram of a circuit assembly formed in accordance with the present invention. The circuit 10 is essentially comprised of six (6) circuit portions. The first portion comprises a switch or button assembly 12 for setting the display; a second portion comprises processor 14 for controlling the application of power to the LEDs to display time, for running a timing program and for running the self-test routine; the third portion comprises the LED elements themselves 16; the fourth portion comprises a conventional power supply circuit 18; the fifth portion comprises the signaling element or beeper 20; and, the sixth portion comprises the monitoring circuit for detecting current flow to the LED elements 16.

With reference to the switch assembly 12, a human operator can set the time of day by pushing the clock switch 26 and adjusting the resulting displayed time at the LED 16 by the Down and Up switches 28, 30. As the unit is primarily intended as a clock and timer for an oven, Timer switch 32 signals to the processor 14 that a time down operation is to be performed, and the amount of the time to be run down is similarly controlled by a human operator by the time Down and time Up switches 28, 30. Such setting of a timer and a time of day clock are conventional and performed in accordance with known steps and processor programs. However, the routine for testing operability of the switch assembly is nonconventional, as will be explained in detail below.

With reference to the LED portion 16 of the assembly, a conventional LED range display is comprised of four (4) digits. Each digit comprises seven (7) linear segments and one (1) decimal point in a manner as shown in the display. Such an arrangement for an LED display is conventional. To illuminate any one of the linear decimal segments of each digit, the LED assembly requires a double drive=application of power to allow current to flow through the segment. In particular, the four digits receive a digit drive through transistors Q2, Q3, Q4 and Q5, respectively. These transistors are controlled by processor 14 at pins PO4, PO5, PO6 and PO7, respectively. The segment drives are effected by the processor 14 by pins P20, P21, P22, P23, P24, P25, P26 and P27. Accordingly, when any of the digits in the LED assembly 16 is driven by a corresponding one of the transistors Q2–Q5, any segment of each digit can be illuminated by latching the associated segment drive through the processor 14. It is only when both the digit drive and the segment drive are enabled that a particular LED segment will be illuminated to an observer. Resistors R8–R15 are set to limit the current through any particular segment to obtain the desired illumination.

The power supply portion comprises a standard linear power supply comprised of a transformer 38, bridge rectifier 40, filter cap 42, and regulating transistor Q8. The power supply 18 thus supplies two (2) voltages, VUR and 5 volts for driving the LEDs 16 and processor 14, respectively. The beeper 20 is driven by the processor 14 through pins P30, P36 and P32.

It is a particular feature of the invention that the subject circuit can monitor switch assembly operability and whether any particular LED segment is illuminated, i.e., has a current running therethrough, during the running of a self-test routine, which routine can be completely executed without human operator supervision or observation. As noted above, the transistors Q2–Q5 supply power to each of the four digits in the LED display 16. Microprocessor pins PO4–PO7 each respectively control the transistor switches. Resistors R8–R15 can then be grounded one at a time to turn any particular segment on, or in the case of displaying a numeric digit, four or five of the resistors may be grounded to make a number. Current through the LED segment and through the resistors is controlled by the processor through pins PO4–PO7 and P20–P27 so that both digit drive and segment drive need to be latched on to illuminate a segment.

With particular reference to transistor Q6 and resistor R16 of monitoring circuit portion 22, it is a feature of the invention that the processor monitors at pin P31 whether a minimum current is flowing through resistor R16. Since R16 is connected in parallel with collector/emitter current for all the transistors Q2–Q5, it is only when current is flowing through any of these transistors that pin P31 will be able to detect a logical high or on=, i.e., current flowing through resistor R16. In other words, in order for current to flow through R16, any one of the digit drives and any one of the segment drives must be on. If any one of both digit and segment drives are on, then there should be an illumination at the LED 16. The processor 14 thus can run a predetermined routine to selectively drive each of the segments individually and in sequence, comparing whether current is running through R16 by monitoring the corresponding result at P31, so that when any combination of both a digit drive pin PO4–PO7 and, a segment drive pin P20–P27 are on or high, then it can be assumed that there is an illumination at the LED. When both a digit drive and a segment drive pin are latched on, and no current is sensed through R16, it is assumed that there is a failure in microconnection or LED element so that no illumination is occurring.

Alternatively, when both any of the digit drives and any of the segment drives are not simultaneously on, and there is a current through R16 then it can be assumed that a short is occurring and that the display is commercially unacceptable. An example of when such a short can occur is when a digit drive is turned on, but a segment drive is not and current is still flowing through R16.

Figure 2:
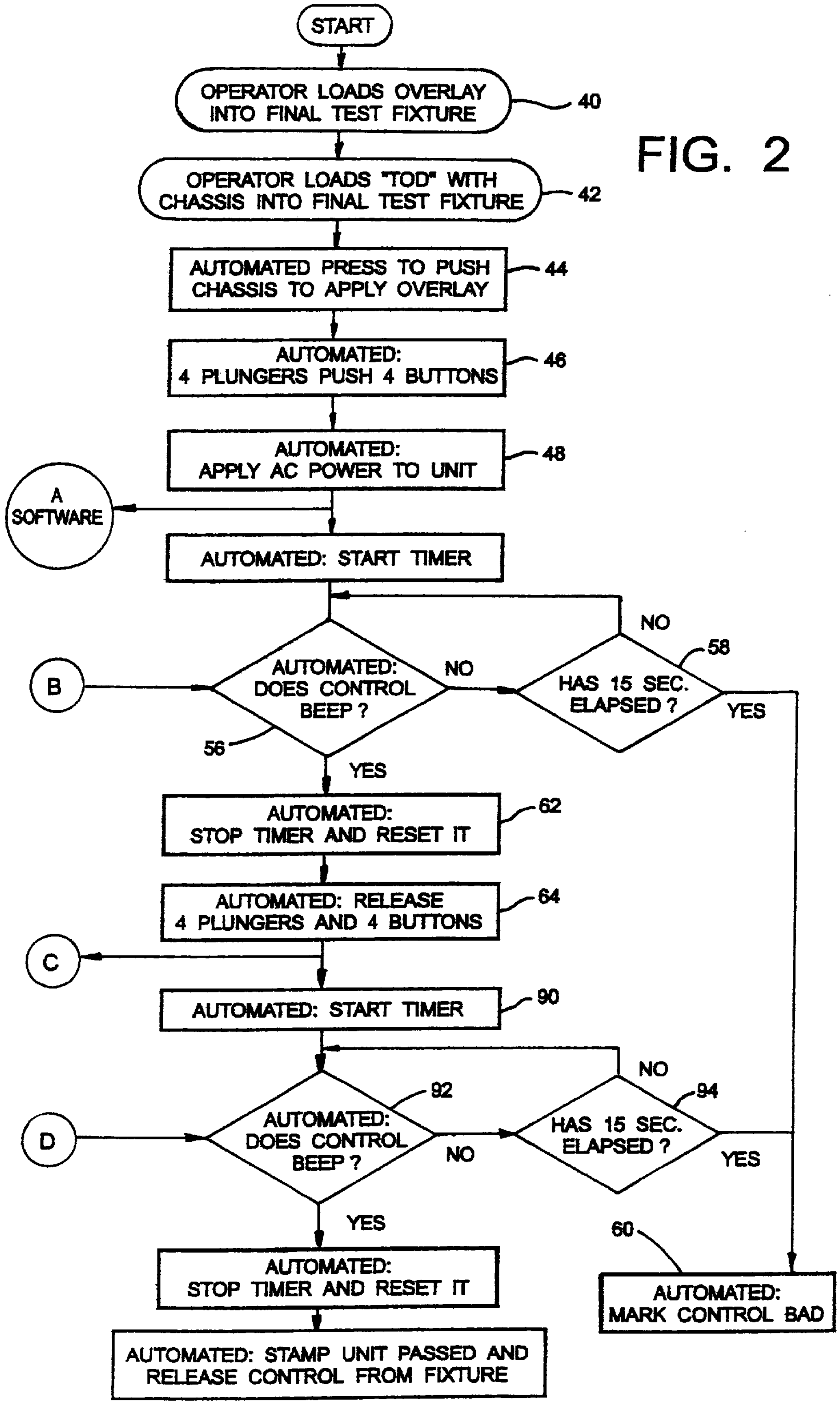
FIG. 2 is a flow chart identifying the steps for executing a self test routine for the circuit shown in FIG. 1.
Figure 3:
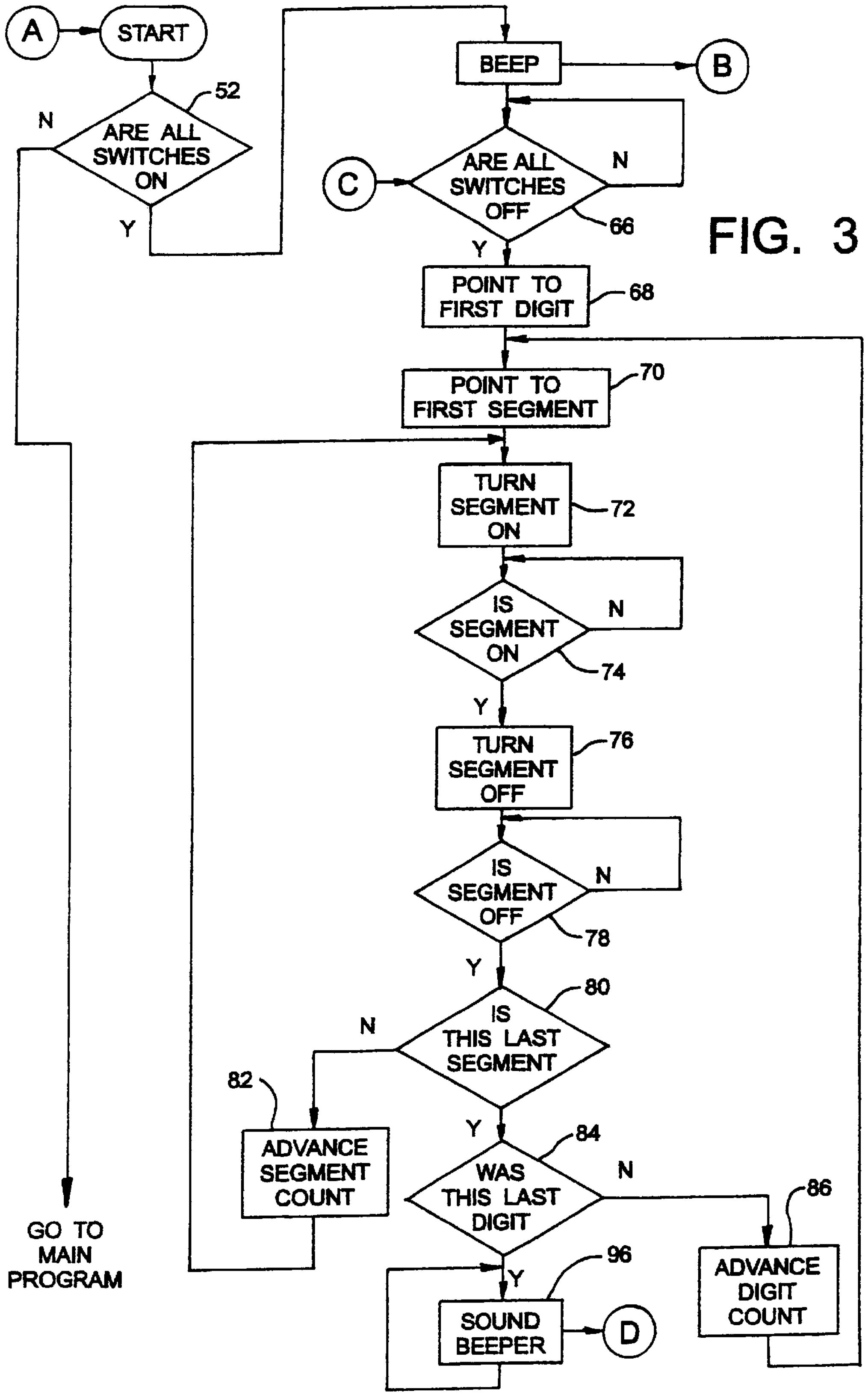
FIG. 3 is a flow chart illustrating the software program stored in the processor of FIG. 1 that is executed to implement the self test routine.

With particular reference to FIGS. 2 and 3, the steps for implementing the automatic self-test routine of the subject invention are more clearly illustrated. FIG. 2 comprises a listing of the steps implemented to practice the self-test routine, while FIG. 3 identifies the software program stored in the microprocessor 14 that controls the application of power to the LED display 16.

With initial reference to FIG. 2, it can be seen that at steps 40 and 42, an operator will load an overlay and a time of day display assembly (TOD) into a chassis for the running of the self test routine. It is a particular advantage of the invention that loading is the only step requiring operator intervention for the routine and even this can be ultimately replaced. At step 44 an automatic press will press the chassis so that the overlay will dispose the switches 26–32 into a predetermined pattern to signal the processor to communicate a test pattern of power signals suitable for testing operability of the LED display 16. As shown in step 46, one particular predetermined pattern is the pressing down of all four switches simultaneously. At step 48, AC power is applied to the unit so it can be transformed by the power supply 18 for the running of the test. Subsequent to the step 48, the microprocessor will recognize the predetermined switch pattern and initiate the self-test software program of FIG. 3. The self-test program is a sub-routine of the processor main program which comprises the normal running of the timer and clock in a conventional manner.

The first part in the self-test routine concerns switch operability and comprises checking whether all the switches are on and if so, the microprocessor will signal the beeper 20 to sound. The test equipment will have an audio sensor and timer (not shown) to sense if the beeper 20 has sounded within a preset time limit. As can be seen at steps 56 and 58, the test equipment will wait fifteen (15) seconds to determine if a beeper sound is made, indicating that all the switches are on. If fifteen seconds elapses without a beeper sound being made, the test equipment will determine that the circuit assembly 10 is bad and will direct the disposition of the circuit as such in step 60. If the beeper 20 does beep, within the fifteen seconds, then the test equipment will stop the timer and reset it and release the plungers operating the switches at steps 62–64. The processor then reenters the test routine program to verify that all switches are off, step 66, i.e., the plunger should have released the switches and the switches should be off.

The second part of the test routine comprises the processor operating the digit drive and the segment drives in the course of sequentially testing all the LED segments, through the processing loop of steps 68–86 of FIG. 3.

With additional reference to FIG. 1, it can be seen that when one of the digits is turned on, one of the transistors Q2–Q5 should be turned on, which is step 68. The next step is to point to one of the segments of the on digit by latching on one of the microprocessor pins P20–P27. The key step of monitoring the test pattern to identify a parameter representative of operability of each of the LED segments is performed at step 74, by monitoring if both the segment drive and digit drive are on, and whether a minimum current is flowing through resistor R16. Transistor Q6 requires about 0.7 volts to turn on so the monitoring circuit effectively comprises a minimum current detector. Thus, the value of R16 is selected to trigger the turn on of Q6 at 0.7 volts and thereby also serve to identify a weak LED segment that is not properly illuminating.

Figure 4A:
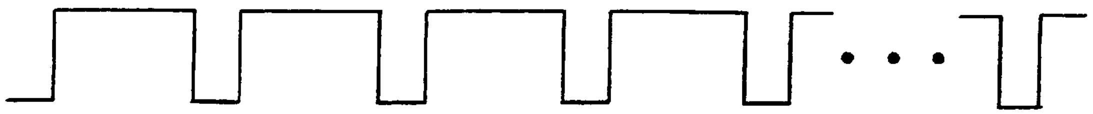
FIGS. 4A–4C are waveform diagrams illustrating test results for passing and failing tests.
Figure 4B:

When all three associated pins are thus latched on, a logical high will be recognized by the processor at pin P31 for the time period that the associated segment drive is on. When all the segments are properly illuminated, a waveform such as shown in FIG. 4A will occur for all eight (8) segments of each digit, for a waveform comprised of thirty two (32) sequential square waves, such as shown therein. When one of the connections to the LED is bad, or the LED itself is bad so that no or a low current flows therethrough, step 74 will recognize that the segment is not on and will continue waiting. This waiting will occur for a predetermined time limit, as shown in steps 90, 92, 94 of FIG. 2. In this case, fifteen (15) seconds is selected for the time limit. Thus, if the entire segment test is not completed within fifteen seconds, the test circuit is marked bad and disposed of as indicated in step 60. FIG. 4B illustrates a waveform which could occur if one of the segments of the LED display is not illuminated. However, in actuality, upon the failure of a certain segment to turn on, then the program would merely wait until the time out of fifteen seconds and then conclude the test. No square waves subsequent to no high shown in FIG. 4B would occur, and the FIGURE is merely provided to show where a logical high should have subsequently occurred during the execution of the test.

Figure 4C:
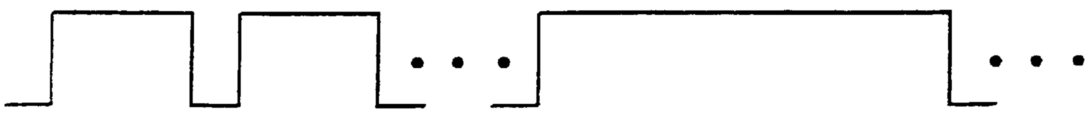

Similarly, step 78 of the test routine program monitors whether the segment is properly turned off when the segment is intended to be turned off at step 76 to determine whether a short has occurred. FIG. 4C illustrates a waveform where a logical low is missing because the segment has not turned off when it should have. Again, step 78 will continue to wait during the time out period until the processor recognizes that the segment is off by recognition of a logical low at pin P31 or until the test timer is timed out by an elapsing fifteen (15) seconds without a control beep such as is illustrated in steps 92, 94.

If all segments of the first digit are successfully tested, i.e., excessive waiting does not occur during the time out period during steps 74 and 78, and the test will move to the next digit by step 86 and then sequentially test all the segments of the next digit by advancing the segment count as per step 82. When all digits and their segments have been successfully tested, the beeper will sound as at step 96, the test fixture will recognize it at step 92, the timer will be stopped and reset and the test fixture will mark the control circuit 10 passed and released for ultimate assembly into a range. It is important to note that the communication of the monitored parameter comprising the current through resistor R16 is made to the processor 14 without requirement of a human observation of an illuminated LED. Further, the processor itself monitors whether the signal on pin P31 goes high or low in accordance with disposition of the pins associated with the digit drive and the segment drive. Accordingly, the microprocessor will recognize a predetermined state pattern of the pins as indicative of a successful test routine and when such comparing indicates a test display fault can distinguish between alternative types of faults.

Although the test fixture equipment has not been shown herein, it can be appreciated by one of ordinary skill in the art that equipment for recognizing a control beep from the LED circuit within a predetermined time limit is readily available to one of ordinary skill in the art.

The invention has been described with reference to the preferred embodiments. Obviously, modifications will occur to others upon reading and understanding of the specification. It is our intention to include all such modifications and alternations in so far as they come within the scope of the appended claims or the equivalents thereof.

Having thus described our invention, we now claim:

1. An automated self test method for an LED display adapted for assembly in an appliance, wherein the display is comprised of a switch assembly, a processor, and LED display elements, the method comprising steps of:

operating the switch assembly in a predetermined manner to communicate a switch test pattern to the processor to initiate a self test program;

first monitoring the switch test pattern for identifying if the switch assembly operates acceptably within a switching predetermined time limit;

communicating a signal test pattern to the LED display elements for operating the LED display elements;

second monitoring a parameter representative of operability of the LED elements for identifying if the LED display elements illuminate acceptably within a display predetermined time element; and, communicating a result signal representative of the first and second monitoring.

2. The method as defined in claim 1 wherein the first monitoring comprises detecting whether a switch of the switch assembly is switched on and switched off.

3. The method as defined in claim 2 wherein the detecting comprises detecting a signal at the processor from the switch assembly.

4. The method as defined in claim 1 wherein the second monitoring comprises detecting a minimum current to the LED display elements.

5. The method as defined in claim 4 wherein the detecting comprises detecting a logical high at the processor from a monitoring switch responsive to said minimum current.

6. The method as defined in claim 4 wherein said second monitoring further comprises the step of determining the type of display fault when a failure occurs.

7. The method as defined in claim 1 wherein operating the switch assembly in a predetermined manner includes pressing each switch in the switch assembly down concurrently.

8. The method as defined in claim 1 further comprising the step of providing ac power to the LED display after the switch assembly is operated in a predetermined manner.

9. The method as defined in claim 1 further comprising the steps of:

monitoring a first parameter representative of the LED elements turning on; and monitoring a second parameter representative of the LED elements turning off.

10. The method as defined in claim 9 wherein said step of monitoring a first parameter comprises the steps of:

setting a minimum threshold for the first parameter that is representative of LED elements failing to turn on;

detecting when the first parameter is below the minimum threshold; and communicating that the first parameter is below the minimum threshold in response thereto.

11. The method as defined in claim 1 wherein the communicating a result signal comprises the step of indicating that the self-test is unsuccessful if the first monitoring detects that the switch assembly operates unacceptably.

12. The method as defined in claim 11 wherein said communicating a result signal further comprises the step of indicating that the self-test is unsuccessful if said second monitoring detects that the LED display elements do not illuminate acceptably.

13. An automated self test method for an LED display adapted for assembly in an appliance, wherein the display is comprised of a switch assembly, a processor, and LED display elements, the method comprising the steps of:

(a) actuating the switches in the switch assembly in a predetermined pattern to communicate to the processor to initiate an LED self test program;

(b) monitoring the switch assembly during a first predetermined period of time;

(c) indicating proper operation if the switch assembly operates acceptably;

(d) during a second predetermined period of time, (1) individually commanding an element of the LED display to turn on;

(2) monitoring power flow to the element of the LED display;

(3) comparing the power flow to a predetermined threshold;

(4) indicating proper operation of the element of the LED display when the monitored power flow is greater than the predetermined threshold;

(5) individually commanding the element of the LED display to turn off when the step of comparing indicates the element of the LED display is operating properly;

(6) monitoring the power flow to the element of the LED display;

(7) comparing the power flow to the predetermined threshold;

(8) indicating proper operation of the element of the LED display when the monitored power flow is less than the predetermined threshold;

(e) indicating proper operation of the LED display operation if the LED display element operates acceptably during the second predetermined period of time; and (f) communicating the self test as successful when the switch assembly and the LED display element have operated acceptably.

14. The method as defined in claim 13 wherein step (d) is repeated for each element of the LED display.

15. The method as defined in claim 13 wherein each switch in the switch assembly is actuated in a predetermined manner.

* * * * *